(12) United States Patent
Yang et al.

(10) Patent No.: US 9,269,784 B2
(45) Date of Patent: Feb. 23, 2016

(54) GALLIUM ARSENIDE BASED DEVICE HAVING A NARROW BAND-GAP SEMICONDUCTOR CONTACT LAYER

(71) Applicant: Global Communication Semiconductors, INC., Torrance, CA (US)

(72) Inventors: Yuefei Yang, Torrance, CA (US); Shing-Kuo Wang, Torrance, CA (US); Liping D. Hou, Torrance, CA (US)

(73) Assignee: GLOBAL COMMUNICATION SEMICONDUCTORS, INC., Torrance, CA (US)

( * ) Notice: Subject to any disclaimer, the term of this patent is extended or adjusted under 35 U.S.C. 154(b) by 0 days.

(21) Appl. No.: 14/463,612

(22) Filed: Aug. 19, 2014

(65) Prior Publication Data

US 2015/0054036 A1     Feb. 26, 2015

Related U.S. Application Data

(60) Provisional application No. 61/868,504, filed on Aug. 21, 2013.

(51) Int. Cl.
    *H01L 29/66*     (2006.01)
    *H01L 29/45*     (2006.01)
    *H01L 29/778*     (2006.01)
    *H01L 29/737*     (2006.01)
    *H01L 29/205*     (2006.01)
    *H01L 23/64*     (2006.01)
    *H01L 27/06*     (2006.01)
(Continued)

(52) U.S. Cl.
CPC ............ *H01L 29/452* (2013.01); *H01L 23/642* (2013.01); *H01L 27/0605* (2013.01); *H01L 29/205* (2013.01); *H01L 29/7371* (2013.01); *H01L 29/7786* (2013.01); *H01L 21/563* (2013.01); *H01L 23/295* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ............ H01L 27/0623; H01L 29/7786; H01L 29/7371; H01L 29/205; H01L 29/452; H01L 23/53214; H01L 23/53228
See application file for complete search history.

(56) References Cited

U.S. PATENT DOCUMENTS 6,465,804 B1 * 10/2002 Shamir .................. B82Y 10/00
                                                       257/197
7,868,335 B1 * 1/2011 Li ........................ H01L 29/155
                                                       257/103

(Continued)

*Primary Examiner* — Bilkis Jahan
(74) *Attorney, Agent, or Firm* — Morgan, Lewis & Bockius LLP

(57) ABSTRACT

A device includes a semiconductor die. The semiconductor die includes a plurality of semiconductor layers disposed on a GaAs substrate, including a first semiconductor layer having a first band-gap and a second semiconductor layer having a second band-gap. The semiconductor die further includes a contact layer disposed epitaxially upon the first semiconductor layer. The contact layer has a thickness that is less than a critical thickness. The second semiconductor layer is epitaxially disposed upon the contact layer. The contact layer has a third band-gap that is less than the first band-gap and the second band-gap. The semiconductor die further includes a conductive layer disposed upon the contact layer to form an ohmic contact. The conductive layer comprises one or more metal layers compatible with silicon processing techniques.

17 Claims, 7 Drawing Sheets

(51) Int. Cl.
  *H01L 23/29* (2006.01)
  *H01L 21/56* (2006.01)

(56) References Cited

U.S. PATENT DOCUMENTS

| | | | |
|---|---|---|---|
| 2002/0125498 A1* | 9/2002 | Welser | H01L 21/02392 257/197 |
| 2003/0015720 A1* | 1/2003 | Lian et al. | 257/98 |
| 2003/0017690 A1* | 1/2003 | Chason | 438/602 |
| 2004/0124435 A1* | 7/2004 | D'Evelyn | C30B 25/02 257/103 |
| 2005/0139863 A1* | 6/2005 | Welser | H01L 29/1004 257/197 |
| 2007/0201523 A1* | 8/2007 | Walter | H01L 33/04 372/43.01 |

* cited by examiner

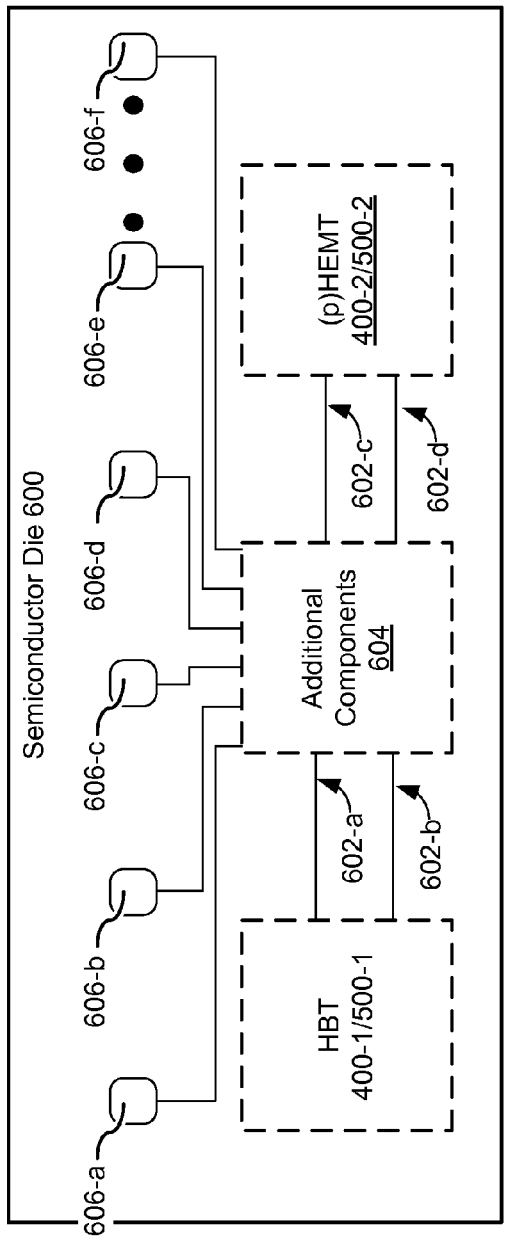
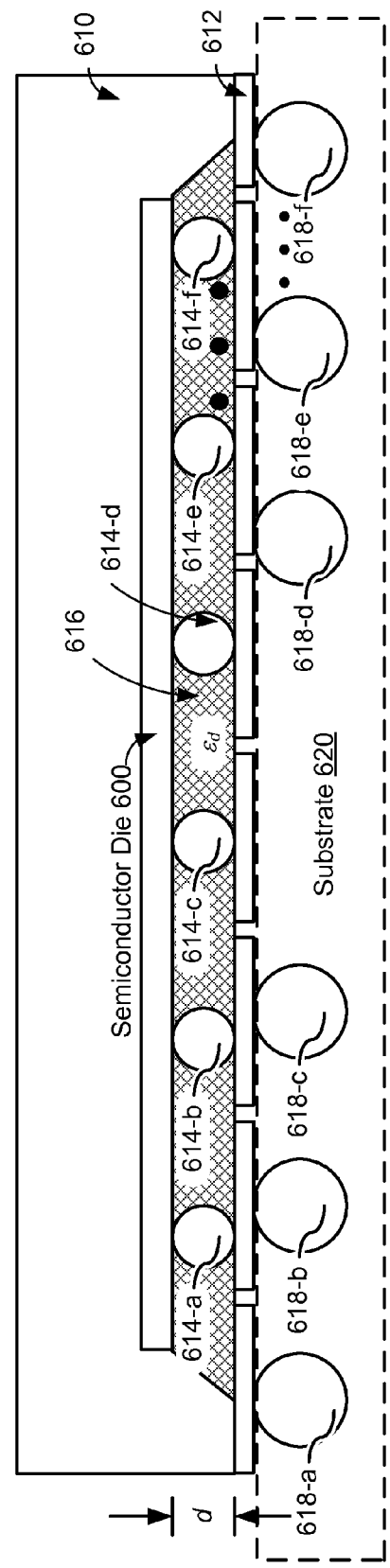
FIGURE 6A
FIGURE 6B

GALLIUM ARSENIDE BASED DEVICE HAVING A NARROW BAND-GAP SEMICONDUCTOR CONTACT LAYER

RELATED APPLICATIONS

This application claims priority to U.S. Provisional Patent Application No. 61/868,504, filed Aug. 21, 2013, which is hereby incorporated by reference in its entirety.

FIELD

The present application relates generally to semiconductor devices for use in radio frequency applications. The present application relates specifically to heterojunction bipolar transistors and high-electron mobility transistors fabricated on a gallium arsenide substrate using processes and materials compatible with silicon processing lines.

BACKGROUND

While the benefits of implementing virtually any high frequency electronic device using gallium arsenide (GaAs) are well known, doing so has traditionally required fabricating such GaAs based devices on a separate processing line from conventional silicon based devices.

One reason for this requirement is that ohmic contacts for GaAs based devices are traditionally fabricated using gold (Au), because non-Au metals do not form good ohmic contacts with n-type GaAs. Gold, however, contaminates silicon processing lines in a number of ways. Among the problems associated with gold contamination in silicon processing lines is the unwanted creation of several inter-metallic compounds (e.g., "white plaque" and "purple plaque") that increase device resistance and often result in device failure. The use of gold based ohmic contacts is therefore an impediment to the ability to process (e.g., fabricate) GaAs based devices on silicon processing lines. Thus, non-gold ohmic contacts for GaAs based devices are needed.

Another reason GaAs based devices typically require a separate processing line is that microstrip transmission lines for GaAs based devices are typically fabricated with a ground-plane on the back-side of a GaAs wafer. Precision wafer thinning is then needed to control the transmission line impedance. Moreover, a back-side ground plan and through-substrate vias are typically needed. Traditional silicon processing lines, however, are not equipped for such processing techniques. Thus, transmission lines for GaAs based devices that require back-side processing and precision wafer thinning represent an impediment to the ability to process (e.g., fabricate) GaAs based devices on silicon processing lines. Thus, transmission lines fabricated with only front-side processing techniques are needed.

SUMMARY

To address the aforementioned problems, some embodiments provide a device that includes a semiconductor die. The semiconductor die includes a plurality of semiconductor layers disposed on a GaAs substrate, including a first semiconductor layer having a first band-gap and a second semiconductor layer having a second band-gap. The semiconductor die further includes a contact layer disposed epitaxially upon the first semiconductor layer. The contact layer has a thickness that is less than a critical thickness. The second semiconductor layer is epitaxially disposed upon the contact layer. The contact layer has a third band-gap that is less than the first band-gap and the second band-gap. The semiconductor die further includes a conductive layer disposed upon the contact layer to form an ohmic contact. The conductive layer includes one or more metal layers compatible with silicon processing techniques.

In some embodiments, the conductive layer does not include gold.

In some embodiments, the device further includes metal interconnections between circuit components of a circuit disposed on the substrate of the semiconductor die. The metal interconnections include aluminum-based metal interconnections or copper-based metal interconnections.

In some embodiments, the device further includes a flip chip module mechanically and electrically coupled to the semiconductor die. The flip chip module includes a ground plane that, together with the metal interconnections, forms one or more transmission lines. The device further includes a plurality of metal connectors mechanically and electrically coupled to a plurality of metal contacts of a circuit disposed on the substrate of the semiconductor die. The plurality of metal contacts includes a metal contact electrically coupled to the ohmic contact.

In some embodiments, the device further includes dielectric filler disposed between the semiconductor die and the ground plane of the flip chip module. A transmission line of the one or more transmission lines has a transmission line impedance corresponding to a thickness of the dielectric filler disposed between the semiconductor die and the ground plane of the flip chip module and a dielectric constant of the dielectric filler.

In some embodiments, the device includes a heterojunction bipolar transistor (HBT) having a base, collector and emitter. The collector includes the contact layer, having the third band-gap that is less than the first band-gap and the second band-gap. The collector also includes the second semiconductor layer disposed epitaxially upon the contact layer. The ohmic contact is a collector ohmic contact. The base includes one or more base semiconductor layers disposed epitaxially upon a respective layer of the collector.

In some embodiments, the device includes a field effect transistor (FET), having a gate, source, and drain. The FET further includes first and second distinct instances of the contact layer. The first instance of the contact layer is (or is part of) the source and the second instance of the contact layer is (or is part of) the drain. The FET further includes first and second distinct instances of the conductive layer. The first instance of the conductive layer is disposed upon the first instance of contact layer to form an ohmic source contact. The second instance of the conductive layer is disposed upon the second instance of the contact layer to form an ohmic drain contact.

In some embodiments, the FET is a metal semiconductor field effect transistor (MESFET).

In some embodiments, the FET is a high electron-mobility transistor (HEMT). In some embodiments, the HEMT is a pseudomorphic HEMT (pHEMT).

In some embodiments, the device is a monolithically integrated circuit and further includes one or more additional active circuit components monolithically integrated onto the semiconductor die.

In some embodiments, the contact layer is characterized by the chemical formula $In_xGa_{1-x}As$ or $In_xGa_{1-x}Sb$. In some embodiments, x is a value between 0.1 and 0.9. In some embodiments, the critical thickness is determined in accordance with a value of x.

In some embodiments, the contact layer is Ge.

In some embodiments, the conductive layer is a metal selected from the group consisting of: Ti, Al, Ni, W, Ge, Pd, Pt, Cu, combinations thereof, and alloys thereof.

To address the aforementioned problems, some embodiments provide a semiconductor device monolithically integrated on a substrate. The semiconductor device includes a field effect transistor (FET) and a heterojunction bipolar transistor (HBT).

The FET includes a first instance of a FET layer and first and second distinct instances of a first contact layer disposed epitaxially upon the first instance of the plurality of semiconductor layers. The first contact layer has a thickness that is less than a first critical thickness. The FET further includes first and second distinct instances of a first conductive layer. The first instance of the first conductive layer is disposed upon the first instance of the first contact layer to form an ohmic source contact. The second instance of the first conductive layer is disposed upon the second instance of the first contact layer to form an ohmic drain contact.

The HBT includes a second distinct instance of the FET layer, a third instance of the first contact layer, one or more sub-collector layers disposed upon the third instance of the contact layer, and a second contact layer disposed upon the one or more sub-collector layers. The second contact layer has a thickness that is less than a second critical thickness. The HBT further includes a collector layer disposed epitaxially upon the second contact layer, and a second conductive layer disposed upon the second contact layer to form an ohmic collector contact.

The first and second conductive layers are compatible with silicon processing techniques. In some embodiments, the first and second conductive layers do not include gold.

In some embodiments, the device further includes metal interconnections between circuit components of a circuit disposed on the substrate. The metal interconnections include aluminum-based metal interconnections or copper-based metal interconnections.

In some embodiments, the device further includes a flip chip module mechanically and electrically coupled to the substrate. The flip chip module includes a ground plane that, together with the metal interconnections, forms one or more transmission lines. The flip clip module further includes a plurality of metal connectors mechanically and electrically coupled to a plurality of metal contacts of the circuit disposed on the substrate. The plurality of metal contacts includes a metal contact electrically coupled to at least one of the ohmic source contact, the ohmic drain contact, and the ohmic collector contact.

In some embodiments, the device further includes dielectric filler disposed between the substrate and the ground plane of the flip chip module. A transmission line of the one or more transmission lines has a transmission line impedance corresponding to a thickness of the dielectric filler disposed between the substrate and the ground plane of the flip chip module and a dielectric constant of the dielectric filler.

In some embodiments, the FET is a metal semiconductor field effect transistor (MESFET).

In some embodiments, the FET is a high electron-mobility transistor (HEMT). In some embodiments, the HEMT is a pseudomorphic HEMT (pHEMT).

In some embodiments, at least one of the first contact layer and the second contact layer is characterized by the chemical formula $In_xGa_{1-x}As$ or $In_xGa_{1-x}Sb$. In some embodiments, x is a value between 0.1 and 0.9. In some embodiments, at least one of the first critical thickness and the second critical thickness is determined in accordance with a value of x.

In some embodiments, the contact layer comprises Ge.

In some embodiments, the first and second conductive layers include a metal selected from the group consisting of: Ti, Al, Ni, W, Ge, Pd, Pt, Cu, combinations thereof, and alloys thereof.

To address the aforementioned problems, some embodiments provide a semiconductor device monolithically integrated on a substrate. The semiconductor device includes a FET (FET) and a heterojunction bipolar transistor (HBT).

In some embodiments, the FET includes a first instance of a FET layer, first and second distinct instances of one or more sub-collector layers disposed upon FET layer, and first and second distinct instances of a contact layer. The first instance of the contact layer is disposed upon the first instance of the one more sub-collector layers. The second instance of the contact layer is disposed upon the second instance of the one more sub-collector layers. The contact layer has a thickness that is less than a critical thickness.

The FET further includes first and second distinct instances of a conductive layer. The first instance of the conductive layer is disposed upon the first instance of contact layer to form an ohmic source contact. The second instance of the conductive layer is disposed upon the second instance of the contact layer to form an ohmic drain contact.

The HBT includes a second distinct instance of the FET layer, a third distinct instance of the one or more sub-collector layers, a third distinct instance of the contact layer, and a third distinct instance of the conductive layer. The third instance of the conductive layer is disposed upon the third instance of contact layer to form an ohmic collector contact. The HBT further includes a collector layer disposed epitaxially upon the third instance of the contact layer.

The conductive layer is compatible with silicon processing techniques. In some embodiments, the conductive layer does not include gold.

In some embodiments, the device further includes metal interconnections between circuit components of a circuit disposed on the substrate. The metal interconnections include aluminum-based metal interconnections or copper-based metal interconnections.

In some embodiments, the device further includes a flip chip module mechanically and electrically coupled to the substrate. The flip chip module includes a ground plane that, together with the metal interconnections, forms one or more transmission lines. The device further includes a plurality of metal connectors mechanically and electrically coupled to a plurality of metal contacts of the circuit disposed on the substrate. The plurality of metal contacts includes a metal contact electrically coupled to at least one of the ohmic source contact, the ohmic drain contact, and the ohmic collector contact.

In some embodiments, the device further includes dielectric filler disposed between the substrate and the ground plane of the flip chip module. A transmission line of the one or more transmission lines has a transmission line impedance corresponding to a thickness of the dielectric filler disposed between the substrate and the ground plane of the flip chip module and a dielectric constant of the dielectric filler.

In some embodiments, the FET is a metal semiconductor field effect transistor (MESFET).

In some embodiments, the FET is a high electron-mobility transistor (HEMT). In some embodiments, the HEMT is a pseudomorphic HEMT (pHEMT).

In some embodiments, the contact layer is characterized by the chemical formula $In_xGa_{1-x}As$ or $In_xGa_{1-x}Sb$. In some embodiments, x is a value between 0.1 and 0.9. In some embodiments, the critical thickness is determined in accordance with a value of x.

In some implementations, the contact layer comprises Ge.

In some implementations, the conductive layer includes a metal selected from the group consisting of: Ti, Al, Ni, W, Ge, Pd, Pt, Cu, combinations thereof, and alloys thereof.

BRIEF DESCRIPTION OF THE DRAWINGS

FIG. 6A illustrates a schematic diagram of a top view of a circuit disposed on a semiconductor die, in accordance with some embodiments.

FIG. 6B illustrates a cross-sectional side view of a flip chip apparatus that includes the semiconductor die of FIG. 6A, in accordance with some embodiments.

Like reference numerals refer to corresponding parts throughout the drawings.

DESCRIPTION OF EMBODIMENTS

Figure 1:
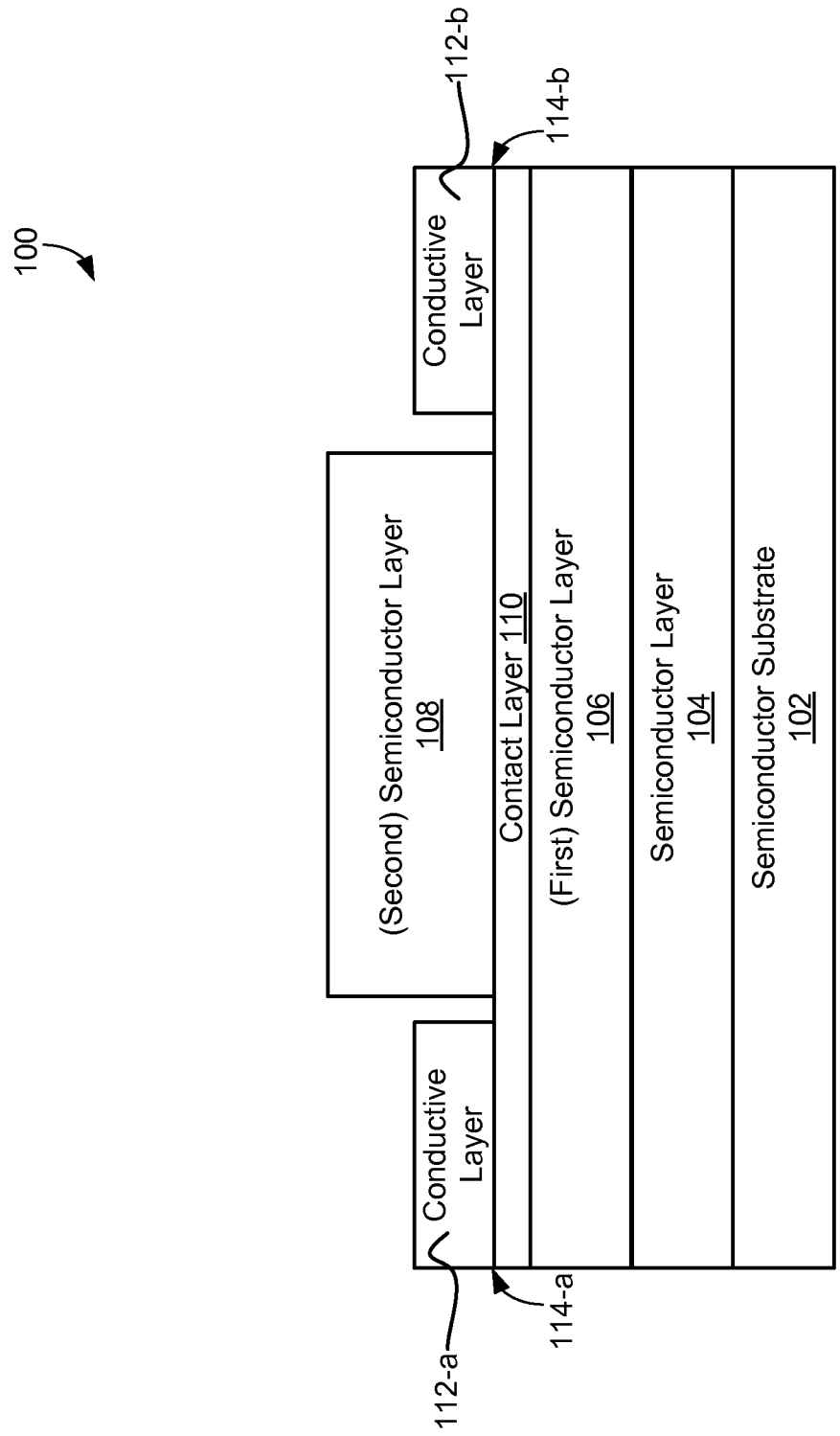
FIG. 1 is a schematic cross-sectional view of a semiconductor device, in accordance with some embodiments.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, operations, elements, and/or components, but do not preclude the presence or addition of one or more other features, integers, operations, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

For convenience, alloys of materials will be referred to by the name or chemical symbol of their parent compound. For example, any molar ratio of silicon and germanium (e.g., $Si_xGe_{1-x}$, or alloys of $Si_xGe_{1-x}$ containing additional dopants) are herein referred to as silicon germanium, or by the chemical symbol SiGe. As another example, any molar ratio of indium, gallium and arsenide (e.g., $In_xGa_{1-x}As$, or alloys of $In_xGa_{1-x}As$ containing additional dopants) are herein referred to as InGaAs. As another example, any molar ratio of indium, gallium and phosphate (e.g., $In_xGa_{1-x}P$, or alloys of $In_xGa_{1-x}P$ containing additional dopants) are herein referred to as InGaP. The use such terminology is not intended to limit the claims that follow to specific chemical formulas or the use of specific dopants.

As used herein, the term "ohmic contact" refers to a non-rectifying junction (e.g., a hetero junction between two distinct materials having a current-voltage relationship in which current through the hetero junction varies in a substantially linear and substantially symmetric manner with voltage applied across the hetero-junction).

As used herein, the terms "layer" and "sub-layer" are used only for convenience of explanation and not intended to limit the claims that follow. In general, the term "layer" is used to denote one or more sub-layer(s) that together serve a particular device function (e.g., a device emitter, or a contact layer that provides a surface on which to fabricate an ohmic contact). In general, the term "sub-layer" is used to denote material that has been deposited in a single fabrication operation or deposited via repeated cycling of a similar fabrication operation (e.g., repeated atomic layer deposition cycles, or continuous deposition while vary one or more process parameters such as doping concentration, etc.)

In general, for ease of explanation, sub-layers are designated by reference numbers comprising a reference number of a parent layer followed by a hyphen and a number. For example, a layer 50 may have sub-layers 50-1 and 50-2.

In general, for ease of explanation, distinct instances of layers are designated by reference numbers comprising a reference number of a parent layer followed by a hyphen and a letter. For example, a device may include first and second distinct instances of layer 50, which are designated "layer 50-*a*" and "layer 50-*b*." Unless otherwise noted, distinct instances of layers are electrically, physically and/or mechanically isolated from other distinct instances of the same layer. In some implementations, two distinct instances of a layer are formed (e.g., deposited) together (e.g., simultaneously or concurrently) and then subsequently electrically, physically and/or mechanically isolated to form the two distinct instances of the layer. For brevity, the words "instance of" are sometimes dropped after the first use when referring to distinct instances of a layer. For example, in the following description, references are made in the form of "layer 50-*a*" without reiterating that layer 50-*a* is a distinct instance of layer 50.

Reference will now be made in detail to various embodiments, examples of which are illustrated in the accompanying drawings. In the following detailed description, numerous specific details are set forth in order to provide a thorough understanding of the present disclosure and the described embodiments herein. However, embodiments described herein may be practiced without these specific details. In other instances, well-known methods, procedures, components, and mechanical apparatus have not been described in detail so as not to unnecessarily obscure aspects of the embodiments.

FIG. 1 is a schematic cross-sectional view of a semiconductor device 100, in accordance with some embodiments. As described below, semiconductor device 100 provides an ohmic contact with an intermediate layer in a plurality of epitaxial gallium arsenide (GaAs) based semiconductor layers.

Semiconductor device 100 includes a semiconductor substrate 102. In some embodiments, semiconductor substrate 102 comprises a gallium arsenide (GaAs) material. In some embodiments, semiconductor substrate 102 comprises a III-V compound distinct from GaAs including, but not limited to: gallium phosphide (GaP), indium phosphide (InP), gallium nitride (GaN). In some embodiments, semiconductor substrate 102 comprises silicon carbide. In some embodiments, semiconductor substrate 102 is grown or bonded to a silicon substrate. In some embodiments, semiconductor substrate 102 is nearly intrinsic (e.g., is very lightly doped or not doped at all). In some embodiments, semiconductor substrate 102 is semi-insulating (SI) or insulating. Alternatively, semiconductor substrate 102 is extrinsic (e.g., doped with p-type dopants or n-type dopants).

In some embodiments, semiconductor substrate 102 is a wafer. Alternatively, the semiconductor substrate 102 is a portion of a wafer (e.g., a chip or die).

Semiconductor device 100 also includes a plurality of semiconductor layers disposed on semiconductor substrate 102. These semiconductor layers optionally include semiconductor layer 104, and include a first semiconductor layer 106 having a first band-gap and a second semiconductor layer 108 having a second band-gap.

In some embodiments, the first band-gap and the second band-gap are substantially equal. For example, in some embodiments, first semiconductor layer 106 and second semiconductor layer 108 comprise the same parent material but with different dopants (e.g., impurities) and/or different concentrations of dopants. In such a case, the first band-gap and the second band-gap are substantially the equal and differ only slightly based on band-gap narrowing effects.

Semiconductor device 100 also includes a contact layer 110 disposed epitaxially upon first semiconductor layer 106. In some implementations, as described below, the contact layer comprises InGaAs. In some implementations, the contact layer comprises InGaSb or Ge. More specifically, in some implementations, contact layer 110 has a crystal structure that is in registry with a crystal structure of first semiconductor layer 106. In order to remain epitaxial with first semiconductor layer 106, contact layer 110 has a thickness that is less than a critical thickness.

The critical thickness is a thickness below which, and only below which, contact layer 110 remains epitaxial with first semiconductor layer 106. Viewed another way, under the critical thickness, the crystal structure of contact layer 110 is sufficiently pliable to adopt the underlying crystal structure of first semiconductor layer 106, and in doing so, the crystal structure of contact layer 110 provides a crystalline template on which further epitaxial layers are disposed. For example, second semiconductor layer 108 is epitaxially disposed upon (e.g., disposed directly upon) contact layer 110. For thicknesses greater than the critical thickness, crystal lattice mismatch causes the crystal structure of contact layer 110 to relax and generate material defects that degrade the quality of subsequent epitaxial layers grown on top of it.

In some embodiments, contact layer 110 is characterized by the chemical formula $In_xGa_{1-x}As$. In some embodiments, x is a value between 0.1 and 0.9. In some embodiments, the critical thickness is determined in accordance with a value of x. A prophetic example of a relationship between the value of x and the critical thickness can be found in FIG. 3 of U.S. Pat. No. 5,060,030 issued to Hoke on Oct. 22, 1991 for a "Pseudomorphic HEMT having strained compensation layer." U.S. Pat. No. 5,060,030 is incorporated herein by reference in its entirety.

Epitaxial semiconductor layers such as first semiconductor layer 106, contact layer 110 and second semiconductor layer 108 can be fabricated using any epitaxial growth method such as molecular beam epitaxy, atomic layer deposition, or metalorganic vapor phase epitaxy. When patterning is necessary, patterning is achieved using techniques such as optical lithography, extreme ultraviolet lithographic, electron beam lithography, wet etching, dry etching and lift-off techniques. Such techniques can be used alone or in combination to produce the desired patterning.

Contact layer 110 comprises a semiconductor that has a third band-gap that is less than the first band-gap and the second band-gap. A conductive layer 112 is disposed upon contact layer 110 to form one or more ohmic contacts. In some embodiments, conductive layer 112 includes one or more metal layers compatible with silicon processing techniques (e.g., conductive layer 112 does not include gold). As shown in FIG. 1, conductive layers 112-a and 112-b represent distinct instances of conductive layer 112 which form, respectively, ohmic contacts 114-a and 114-b. Because the third band-gap of contact layer 110 is less than the first band-gap of first semiconductor layer 106, a greater variety of material is allowable for conductive layer 112 (while maintaining an ohmic nature of the contact) than if conductive layer 112 were disposed directly upon first semiconductor layer 106. In particular, the lower band-gap obviates the need for a gold based conductive layer, such as a Ni/AuGe based conductive layer. Thus, in some embodiments, conductor layer 112 does not comprise gold (Au). In some embodiments, conductive layer 112 comprises a metal selected from the group consisting of: Ti, Al, Ni, W, Ge, Pd, Pt, Cu, combinations thereof (e.g., multi-layers, and the like), and alloys thereof. For example, in some embodiments, conductor layer 112 comprises Ti/Al multi-layers.

In some embodiments, semiconductor device 100 is a monolithically integrated circuit (e.g., a microwave monolithically integrated circuit, or "MMIC"). In such embodiments, one or more instances of conductive layer 112 provide conductive paths between semiconductor device 100 and one or more additional circuit components (e.g., active circuit components) monolithically integrated onto semiconductor substrate 102. In some embodiments, semiconductor device 100 further includes metal interconnections between the one or more additional circuit components of a circuit disposed on the substrate of the semiconductor die. In some embodiments, the metal interconnections are aluminum-based metal interconnections or copper-based metal interconnections.

Conductive layer 112 can be fabricated using any suitable conducting material compatible with silicon processing techniques. Metal contacts can be deposited using a variety of metal deposition techniques (such as RF or DC sputtering, electroplating, evaporation, pulsed laser deposition, etc) and patterned using the techniques described above.

Figure 2:
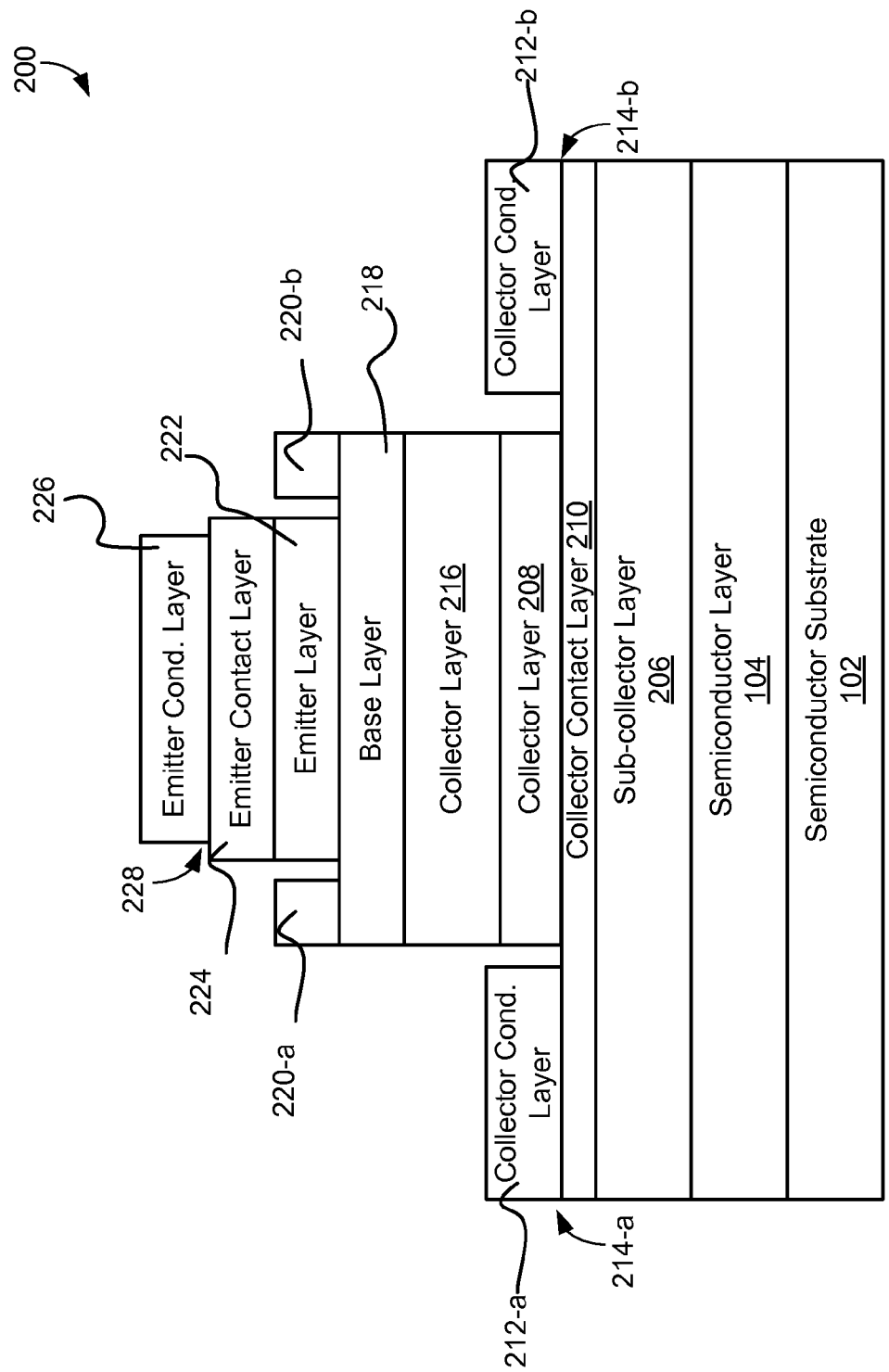
FIG. 2 is a schematic cross-sectional view of a heterojunction bipolar transistor, in accordance with some embodiments.

FIG. 2 is a schematic cross-sectional view of a heterojunction bipolar transistor 200 having a collector, base, and emitter, in accordance with some embodiments. As described below, heterojunction bipolar transistor 200 provides ohmic contacts to the collector and emitter.

In some embodiments, heterojunction bipolar transistor 200 is a double heterojunction bipolar transistor (DHBT). In some embodiments, heterojunction bipolar transistor 200 is an npn HBT. Alternatively, heterojunction bipolar transistor 200 is a pnp HBT.

Heterojunction bipolar transistor 200 includes semiconductor substrate 102, which is analogous to semiconductor substrate 102 described with reference to FIG. 1. Bipolar transistor 200 also optionally includes semiconductor layer 104, which is analogous to semiconductor layer 104 described with reference to FIG. 1. Heterojunction bipolar transistor 200 also includes sub-collector layer 206, which is analogous to first semiconductor layer 106 in that sub-collector layer 206 shares the properties of first semiconductor layer 106 as described with reference to FIG. 1 (e.g., sub-collector layer 206 is characterized by the first band-gap). However, as shown in FIG. 2, sub-collector layer 206 is a specific example of first semiconductor layer 106 in which sub-collector layer 206 is a sub-collector layer (e.g., a layer comprising a sub-collector) of heterojunction bipolar transistor 200. In some embodiments, the sub-collector of heterojunction bipolar transistor 200 includes semiconductor layer 104 (or a portion thereof) in addition to sub-collector layer 206 (e.g., the sub-collector comprises a plurality of layers including a particular layer, sub-collector layer 206, that is characterized by the first band-gap).

In some embodiments, heterojunction bipolar transistor 200 includes a collector contact layer 210 that is analogous to contact layer 110 in that collector contact layer 210 shares the properties of contact layer 110 as described with reference to FIG. 1 (e.g., contact layer 110 is characterized by the third band-gap). However, collector contact layer 210 is a specific example of contact layer 110 in which the collector of heterojunction bipolar transistor 200 comprises collector contact layer 210. In some embodiments, the collector of heterojunction bipolar transistor 200 also includes collector layer 208, which is analogous to second semiconductor layer 108 described with reference to FIG. 1. Collector layer 208 is a specific example of second semiconductor layer 108 in which the collector of heterojunction bipolar transistor 200 includes collector layer 208. As such, collector layer 208 is characterized by the second band-gap and is disposed epitaxially upon collector contact layer 210. The collector of heterojunction bipolar transistor 200 also optionally includes collector layer 216, described in greater detail below.

Heterojunction bipolar transistor 200 includes collector conductive layer 212 (distinct instances of which are shown as collector conductive layers 212-a and 212-b) which is analogous to conductive layer 112. Collector conductive layer 212 specifically forms one or more ohmic collector contacts (e.g., ohmic collector contacts 214-a and 214-b), which couple the collector of heterojunction bipolar transistor 200 to additional circuitry (e.g., additional active circuit components, contact pads, etc.).

The base of heterojunction bipolar transistor 200 includes base layer 218 disposed epitaxially upon a respective layer of the collector (e.g., collector layer 208, or a respective sub-layer of collector layer 216, etc.). Further exemplary details of base layer 218 are described with reference to FIG. 3. The base of heterojunction bipolar transistor 200 is coupled to base conductive layer 220 (e.g., 220-a and 220-b). Base conductive layers 220-a and 220-b comprise any suitable conductive material that is compatible with silicon processing techniques (e.g., conductive layers 220-a and 220-b do not comprise gold).

The emitter of heterojunction bipolar transistor 200 includes an emitter layer 222 disposed epitaxially upon base layer 218. A respective sub-layer of emitter layer 222 has (e.g., is characterized by) a fourth band-gap. Further exemplary details of emitter layer 222 are described with reference to FIG. 3. The emitter of heterojunction bipolar transistor 200 further includes an emitter contact layer 224. Emitter contact layer 224 is characterized by a fifth band-gap that is less than the fourth band-gap. The emitter of heterojunction bipolar transistor 200 is coupled to emitter conductive layer 226 to form an emitter ohmic contact 228. Emitter conductive layer 226 comprises one or more metal sub-layers compatible with silicon processing techniques (e.g., emitter conductive layer 226 does not comprise gold). Emitter contact layer 224 and emitter conductive layer 226 together form an emitter ohmic contact 228. Because the fifth band-gap of emitter contact layer 224 is less than the fourth band-gap of the respective sub-layer of emitter layer 222, a greater variety of materials is allowable for emitter conductive layer 226 (while maintaining an ohmic nature of the contact) than if emitter conductive layer 226 were disposed directly upon the respective sub-layer of emitter layer 222. In particular, the lower band-gap obviates the need for a gold based conductive layer, such as a conductive layer that is formed from or includes Ni/AuGe. In some embodiments, emitter conductive layer 226 is a top epitaxial layer of the device (e.g., no additional semiconductors layers are epitaxially disposed upon emitter contact layer 224). In such a case, emitter contact layer need not be thin (e.g., below the critical thickness), and, in some embodiments, has a thickness greater than the critical thickness of contact layer 224.

Figure 3:
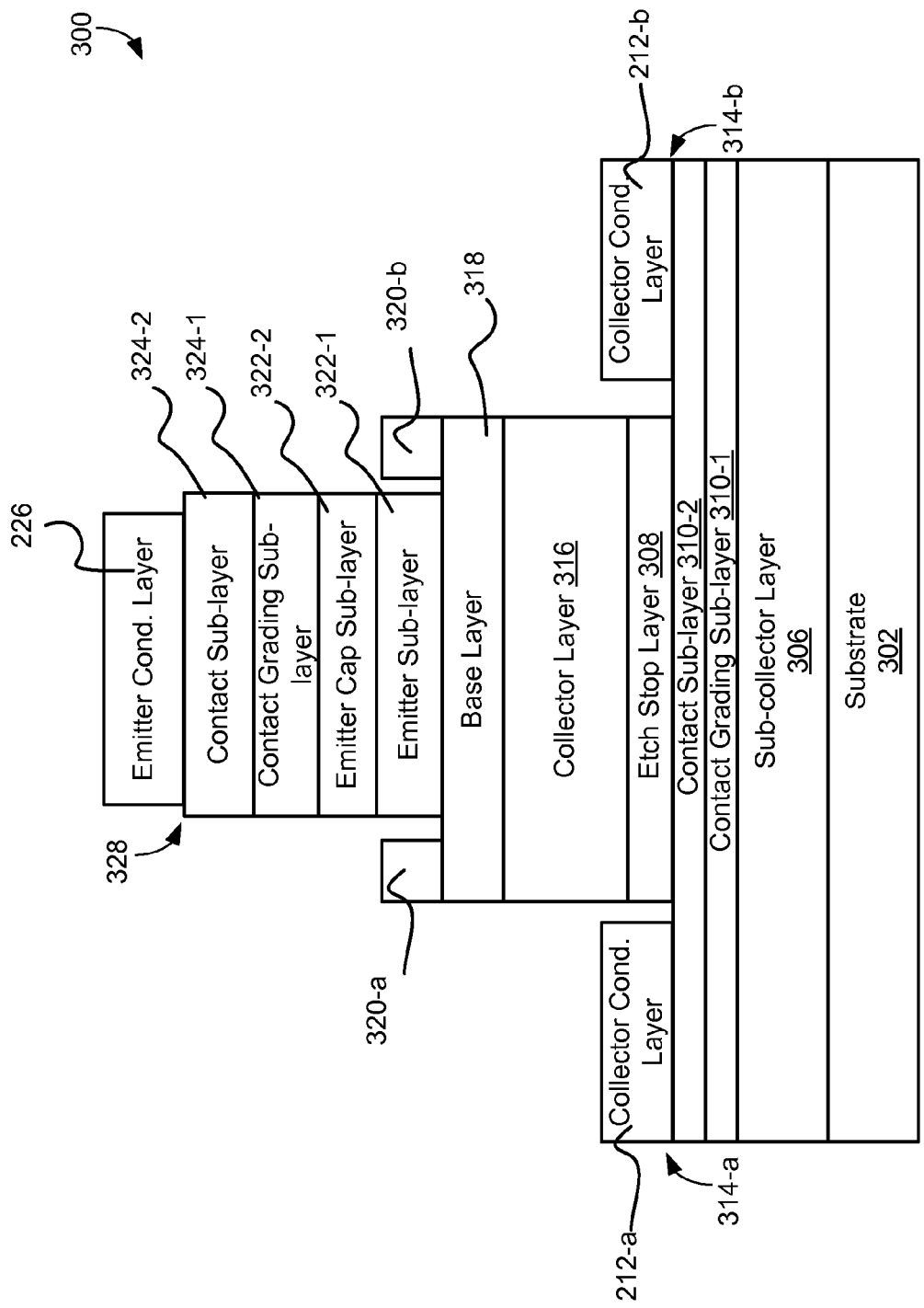
FIG. 3 is a schematic cross-sectional view of a heterojunction bipolar transistor, in accordance with some embodiments.

FIG. 3 is a schematic cross-sectional view of a heterojunction bipolar transistor 300 having a collector, base, and emitter, in accordance with some embodiments.

Heterojunction bipolar transistor 300 is a specific example of heterojunction bipolar transistor 200 described with reference to FIG. 2. To this end, heterojunction bipolar transistor 300 comprises the following exemplary structure:

Heterojunction bipolar transistor 300 includes a substrate 302. In some embodiments, substrate 302 comprises GaAs. In some embodiments, substrate 302 is substantially intrinsic (e.g., is very lightly doped or not doped at all). In some embodiments, GaAs substrate 302 is semi-insulating or insulating. Alternatively, substrate 302 is extrinsic GaAs (e.g., doped with p-type dopants or n-type dopants). In some embodiments, substrate 302 is a wafer. Alternatively, substrate 302 is a portion of a wafer (e.g., a chip or die).

Heterojunction bipolar transistor 300 includes a sub-collector layer 306 that is a specific example of sub-collector layer 206 (FIG. 2). In some embodiments, sub-collector layer 306 is n+ doped GaAs. In some embodiments, sub-collector layer 306 is doped with silicon (Si) atoms (i.e., the dopant atoms comprise Si) at a doping concentration on the order of $1.6 \times 10^{18}$ dopant atoms/cm$^3$. In some embodiments, sub-collector layer 306 has a thickness between 3,000 Å and 7,000 Å.

Heterojunction bipolar transistor 300 includes a contact layer 310 that is a specific example of contact layer 210 (FIG. 2). In some embodiments, contact layer 310 comprises InGaAs. Contact layer 310 optionally comprises a grading sub-layer 310-1. Grading sub-layer 310-1 comprises In$_y$Ga$_{1-y}$As, where "y" is an index (the Indium composition index) that specifies the portion of sub-layer 310-1 that is indium (In). The proportion of indium (In) in grading sub-layer 310-1 varies substantially monotonically with a distance from a first surface of grading sub-layer 310-1. For example, in some embodiments, the indium (In) composition index, y, varies substantially monotonically from y=0 at a surface proximal to sub-collector layer 306 to y=c at a surface distal to sub-collector layer 306, where c is a fixed indium (In)

composition (i.e., c is a fixed predefined value). Grading sub-layer 310-1 thus provides a smooth grading from a pure GaAs material to an $In_cGa_{1-c}As$ material with a fixed indium (In) composition index, c. In some embodiments, the indium (In) composition index y varies substantially monotonically with distance from the surface proximal to sub-collector layer 306 in accordance with a predefined spatial function. In some embodiments, grading sub-layer 310-1 is doped with silicon (Si) atoms (i.e., the dopant atoms comprise Si) at a maximum doping concentration (e.g., at a location of maximum doping) on the order of $1.6 \times 10^{18}$ dopant atoms/cm$^3$. In some embodiments, grading sub-layer 310-1 has a thickness between 20 Å and 100 Å.

In some embodiments, contact layer 310 comprises a respective contact sub-layer 310-2. Contact sub-layer 310-2 comprises $In_cGa_{1-c}As$ where "c" is the fixed Indium (In) composition index. In some embodiments, the value of c is a predefined value between 0.1 and 1.0. In some embodiments, c is a predefined value substantially equal to 0.5. In some embodiments, contact sub-layer 310-2 is n+ doped InGaAs. In some embodiments, contact sub-layer 310-2 is doped with silicon (Si) atoms (i.e., the dopant atoms comprise Si) at a doping concentration on the order of 1 to $6 \times 10^{18}$ dopant atoms/cm$^3$. In some embodiments, contact sub-layer 310-2 has a thickness between 20 Å and 300 Å. In some embodiments, the thickness is determined in accordance with the value of c.

In some embodiments, heterojunction bipolar transistor 300 optionally includes an etch stop layer 308 that is a specific example of collector layer 208 (FIG. 2). In some embodiments, etch stop layer 308 comprises $In_zGa_{1-z}P$, where "z" is an indium (In) composition index. In some embodiments, z is a predefined value substantially equal to 0.5 (e.g., 0.49). In some embodiments, etch stop layer 308 is n+ doped InGaP. In some embodiments, etch stop layer 308 is doped with silicon (Si) atoms (i.e., the dopant atoms comprise Si) at a doping concentration on the order of 1 to $6 \times 10^{18}$ dopant atoms/cm$^3$. In some embodiments, etch stop layer 308 has a thickness between 20 Å and 2500 Å.

Heterojunction bipolar transistor 300 includes collector layer 316 that is a specific example of collector layer 216 (FIG. 2). In some embodiments, collector layer 316 is a single n-doped GaAs layer. In some embodiments, collector layer 316 is doped with silicon (Si) atoms (i.e., the dopant atoms comprise Si) at a doping concentration on the order of 1 to $8 \times 10^{16}$ dopant atoms/cm$^3$. In some embodiments, the doping concentration is spatially non-uniform (e.g., the doping concentration increases with distance from etch stop layer 308). In some embodiments, collector layer 316 has a thickness between 4,000 Å and 30,000 Å.

Heterojunction bipolar transistor 300 includes base layer 318 that is a specific example of base layer 218 (FIG. 2). In some embodiments, base layer 318 is a single p-doped GaAs layer. In some embodiments, base layer 318 is doped with carbon (C) atoms (i.e., the dopant atoms comprise C) at a doping concentration on the order of 1 to $8 \times 10^{19}$ dopant atoms/cm$^3$. In some embodiments, base layer 318 has a thickness between 300 Å and 1,500 Å.

Heterojunction bipolar transistor 300 includes an emitter layer 322 that is a specific example of emitter layer 222 (FIG. 2). Emitter layer 322 optionally includes an emitter sub-layer 322-1. In some embodiments, emitter sub-layer 322-1 comprises $In_uGa_{1-u}P$, where "u" is an indium (In) composition index. In some embodiments, u is a predefined value substantially equal to 0.5 (e.g., 0.49). In some embodiments, emitter sub-layer 322-1 is n-doped InGaP. In some embodiments, emitter sub-layer 322-1 is doped with silicon (Si) atoms (i.e., the dopant atoms comprise Si) at a doping concentration on the order of 1 to $5 \times 10^{17}$ dopant atoms/cm$^3$. In some embodiments, emitter sub-layer 322-1 has a thickness between 400 Å and 600 Å.

Emitter layer 322 also optionally includes an emitter cap sub-layer 322-2. In some embodiments, emitter cap sub-layer 322-2 comprises GaAs. In some embodiments, the emitter cap sub-layer 322-2 is n-doped GaAs. In some embodiments, emitter cap sub-layer 322-2 is doped with silicon (Si) atoms (i.e., the dopant atoms comprise Si) at a doping concentration on the order of 1 to $5 \times 10^{18}$ dopant atoms/cm$^3$. In some embodiments, emitter sub-layer 322-1 has a thickness between 800 Å and 1,500 Å.

Heterojunction bipolar transistor 300 includes a contact layer 324 that is a specific example of emitter contact layer 224 (FIG. 2). In some embodiments, contact layer 324 optionally comprises a respective contact grading sub-layer 324-1. In some embodiments, contact grading sub-layer 324-1 comprises $In_vGa_{1-v}As$ where "v" is an indium (In) composition index. The indium (In) composition v of contact grading sub-layer 324-1 varies substantially monotonically with a distance from a first surface of grading sub-layer 324-1. For example, in some embodiments, emitter cap sub-layer 322-2 is GaAs and the indium (In) composition index v of contact grading sub-layer 324-1 varies substantially monotonically from v=0 at a surface proximal to emitter cap sub-layer 322-2 to v=w at a surface distal to emitter cap sub-layer 322-2, where w is a fixed indium (In) composition index (i.e., w is a fixed predefined value). Contact grading sub-layer 324-1 thus provides a smooth grading from a pure GaAs material to an $In_wGa_{1-w}As$ material with a fixed indium (In) composition index w. In some embodiments, the indium (In) composition v varies substantially monotonically with distance from the surface proximal to emitter cap sub-layer 322-2 in accordance with a predefined spatial function. In some embodiments, contact grading sub-layer 324-1 is doped with tellurium (Te) or selenium (Se) atoms (i.e., the dopant atoms comprise Te or Se) at a maximum doping concentration (e.g., at a location of maximum doping) greater than $1.0 \times 10^{19}$ dopant atoms/cm$^3$. In some embodiments, contact grading sub-layer 324-1 has a thickness between 500 Å and 1,000 Å.

In some embodiments, InGaAs contact layer 324 comprises a respective $In_wGa_{1-w}As$ sub-layer 324-2, where w is the fixed indium (In) composition index. In some embodiments, the value of w is a predefined value between 0.1 and 1.0. In some embodiments, w is a predefined value substantially equal to 0.6. In some embodiments, the $In_wGa_{1-w}As$ sub-layer 324-2 is n+ doped InGaAs. In some embodiments, $In_wGa_{1-w}As$ sub-layer 324-2 is doped with tellurium (Te) or selenium (Se) atoms (i.e., the dopant atoms comprise Te or Se) at a doping concentration greater than $1.0 \times 10^{19}$ dopant atoms/cm$^3$. In some embodiments, the $In_wGa_{1-w}As$ sub-layer 324-2 has a thickness between 500 Å and 1,000 Å.

Heterojunction bipolar transistor 300 includes collector conductor layer 212-a and 212-b, described with reference to FIG. 2, that, together with contact layer 310 form ohmic contacts 314-a and 314-b, respectively.

Heterojunction bipolar transistor 300 includes emitter conductor layer 226, described with reference to FIG. 2, that, together with contact layer 324 form ohmic contact emitter ohmic contact 328.

Figure 4A:
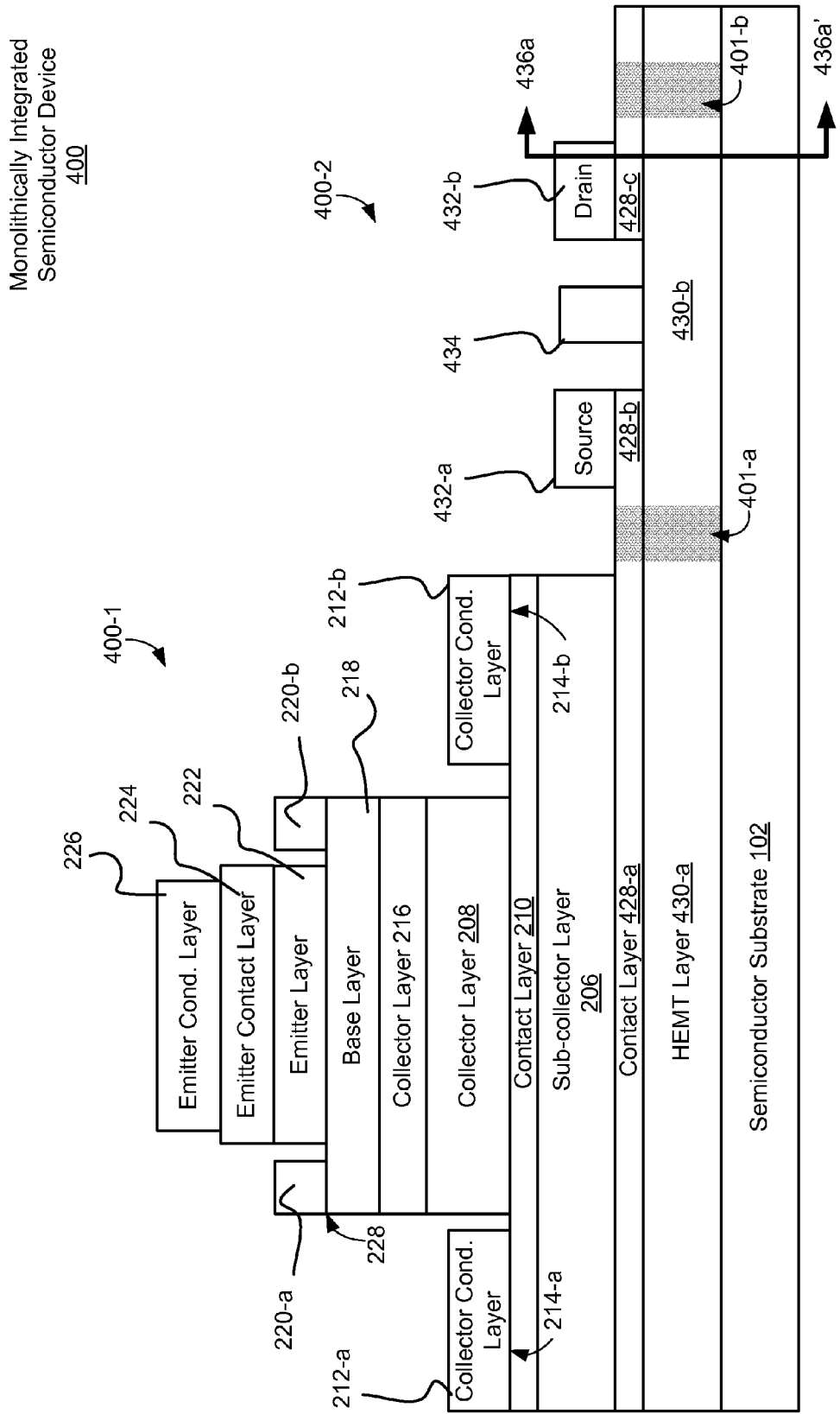
FIG. 4A is a schematic cross-sectional view of a monolithically integrated semiconductor device, in accordance with some embodiments.

FIG. 4A is a schematic cross-sectional view of a monolithically integrated semiconductor device 400, in accordance with some embodiments. Monolithically integrated semiconductor device 400 includes a heterojunction bipolar transistor 400-1 having a collector, base, and emitter. In some embodiments, heterojunction bipolar transistor 400-1 is a double heterojunction bipolar transistor (DHBT).

Monolithically integrated semiconductor device 400 also includes a high-electron-mobility transistor (HEMT) 400-2, which is a field-effect transistor having a source and a drain. In some embodiments, HEMT 400-2 is a pseudomorphic HEMT (pHEMT).

In some embodiments, heterojunction bipolar transistor 400-1 and high-electron-mobility transistor 400-2 are components in a microwave monolithically integrated circuit (MMIC). Monolithically integrated semiconductor device 400 is fabricated on semiconductor substrate 102, which is described with reference to FIG. 1.

High-electron-mobility transistor 400-2 is electrically isolated from other circuit components including heterojunction bipolar transistor 400-1 by isolation regions 401 (e.g., isolation regions 401-a and 401-b). Isolation regions 401 comprise an insulating material. Fabrication of the insulating material can be realized by, for example, a combination of patterned etching and subsequent oxide growth, or, alternatively or in addition, by inducing material damage via ion implantation.

HEMT 400-2 includes a first instance of a HEMT layer 430 (e.g., HEMT layer 430-b) and first and second distinct instances of a contact layer 428 (e.g., contact layer instances 428-b and 428-c) disposed epitaxially upon HEMT layer 430-b.

Contact layer 428 has a thickness that is less than a first critical thickness. The first critical thickness is a thickness below which, and only below which, contact layer 428 remains epitaxial with HEMT layer 430. Viewed another way, under the first critical thickness, the crystal structure of contact layer 428 is sufficiently pliable to adopt the underlying crystal structure of HEMT layer 430, and in doing so, the crystal structure of contact layer 428 provides a crystalline template on which further epitaxial layers are disposed. For thicknesses greater than the first critical thickness, crystal lattice mismatch causes the crystal structure of contact layer 428 to relax and generate material defects that degrade the quality of subsequent epitaxial layers grown on top of it. In some embodiments, contact layer 428 is characterized by the chemical formula $In_aGa_{1-a}As$. In some embodiments, a is a value between 0.1 and 0.9. In some embodiments, the first critical thickness is determined in accordance with a value of a.

HEMT 400-2 further includes first and second distinct instances of a conductive layer 432 (e.g., conductive layers 432-a and 432-b). Conductive layer 432-a is disposed upon contact layer 428-b to form an ohmic source contact. Conductive layer 432-b is disposed upon contact layer 428-c to form an ohmic drain contact. Contact layer 428, HEMT layer 430, and conductive layer 432 are described in greater detail below with reference to FIG. 4B.

High-electron-mobility transistor 400-2 includes a gate 434 which comprises one or more conductive gate sub-layers. A voltage applied between the gate and the body of high-electron-mobility transistor 400-2 (e.g., substrate 102) controls a width of an electron channel within HEMT layer 430-b of high-electron-mobility transistor 400-2.

Heterojunction bipolar transistor 400-1 includes a second distinct instance of HEMT layer 430 (e.g., HEMT layer 430-a) and a third instance of contact layer 428 (e.g., contact layer 428-a). Heterojunction bipolar transistor 400-1 also includes sub-collector layer 206 disposed epitaxially upon contact layer 428-a. Heterojunction bipolar transistor 400-1 further includes a contact layer 210 disposed upon sub-collector layer 206. Sub-collector layer 206 and collector layer 210 are described in greater detail with reference to FIG. 2.

In this example, contact layer 210 has a thickness that is less than a second critical thickness. The second critical thickness is a thickness below which, and only below which, contact layer 210 remains epitaxial with sub-collector layer 206. Viewed another way, under the second critical thickness, the crystal structure of contact layer 210 is sufficiently pliable to adopt the underlying crystal structure of sub-collector layer 206, and in doing so, the crystal structure of contact layer 210 provides a crystalline template on which further epitaxial layers are disposed. For thicknesses greater than the second critical thickness, crystal lattice mismatch causes the crystal structure of contact layer 210 to relax and generate material defects that degrade the quality of subsequent epitaxial layers grown on top of it. In some embodiments, contact layer 210 is characterized by the chemical formula $In_bGa_{1-b}As$. In some embodiments, b is an index having a value between 0.1 and 0.9. In some embodiments, the second critical thickness is determined in accordance with a value of b.

Heterojunction bipolar transistor 400-1 further includes collector layer 208, one or more distinct instances of collector conductive layer 212 (e.g., collector conductive layer 212-a and 212-b), collector layer 216, base layer 218, base conductive layer 220, emitter layer 222, emitter contact layer 224, and emitter conductive layer 226, which have been described in detail with reference to FIG. 2.

Greater detail of an exemplary layer structure along a cross-section 436a-436a' (shown in FIG. 4A) is now described with reference to FIG. 4B.

Figure 4B:
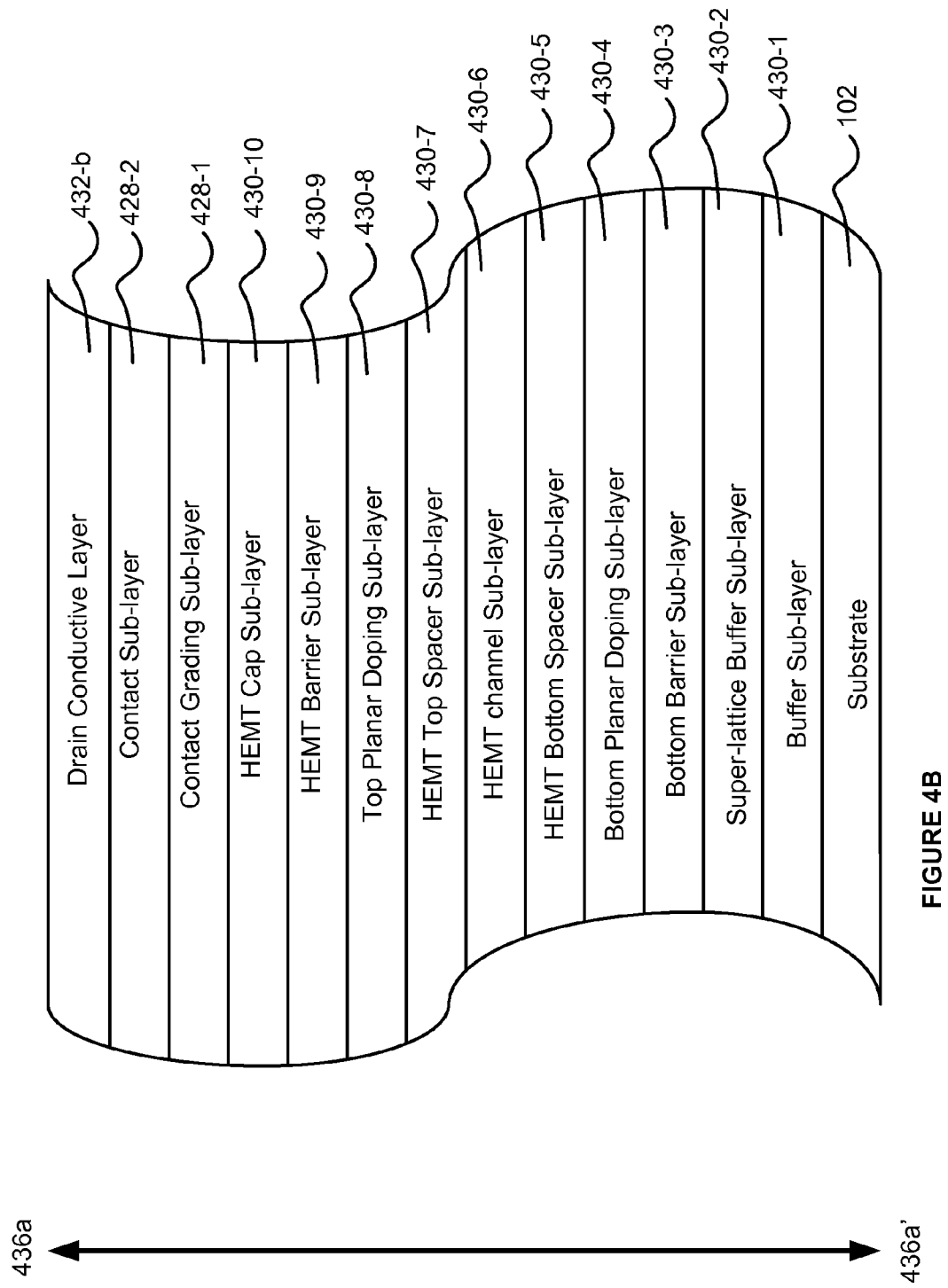
FIG. 4B illustrates an exemplary layer structure along a cross-section of the monolithically integrated semiconductor device of FIG. 4A, in accordance with some embodiments.

FIG. 4B illustrates an exemplary layer structure along cross-section 436a-436a' (cf. FIG. 4A) of monolithically integrated semiconductor device 400. In some embodiments, the sub-layers shown in FIG. 4B are a subset of an overall layer structure. For example, in some embodiments HEMT layer 430 may include one or more additional sub-layers that are not illustrated in FIG. 4B.

Cross-section 436a-436a' includes contact layer 428, HEMT layer 430, and drain conductive layer 432-b. In some embodiments, source conductive layer 432-a is analogous to drain conductive layer 432-b (e.g., source conductive layer 432-a and drain conductive layer 432-b are deposited in the same metallization operation and patterned using lift-off techniques and/or etching).

According to some embodiments, HEMT layer 430 includes a buffer sub-layer 430-1. In some embodiments, buffer sub-layer 430-1 comprises undoped GaAs. In some embodiments, buffer sub-layer 430-1 has a thickness between 1,000 Å and 2,000 Å.

According to some embodiments, HEMT layer 430 includes a super-lattice buffer sub-layer 430-2. In some embodiments, super-lattice buffer sub-layer 430-2 comprises a super-lattice of alternating sub-sub-layers of undoped GaAs and $Al_\alpha Ga_{1-\alpha}As$ where "α" is an aluminum composition index. In some embodiments, "α" has a value between 0.2 and 0.25. In some embodiments, super-lattice buffer sub-layer 430-2 has a thickness between 2,000 Å and 5,000 Å.

According to some embodiments, HEMT layer 430 includes a bottom barrier sub-layer 430-3. In some embodiments, bottom barrier sub-layer 430-3 comprises undoped $Al_\beta Ga_{1-\beta}As$ where "β" is an aluminum composition index. In some embodiments, "β" has a value between 0.2 and 0.25. In some embodiments, bottom barrier sub-layer 430-3 has a thickness between 300 Å and 800 Å.

According to some embodiments, HEMT layer 430 includes a bottom planar doping sub-layer 430-4. In some embodiments, bottom planar doping sub-layer 430-4 is a delta-doping sub-layer comprising silicon (Si). In some circumstances, because bottom planar doping sub-layer 430-4 is a delta-doping sub-layer, it has substantially no thickness as the silicon atoms diffuse substantially entirely into adjacent layers. Alternatively, bottom planar doping sub-layer 430-4 has a thickness of one to several monolayers.

According to some embodiments, HEMT layer 430 includes a HEMT bottom spacer sub-layer 430-5. In some embodiments, HEMT bottom spacer sub-layer 430-5 comprises undoped $Al_\chi Ga_{1-\chi}As$ where "$\chi$" is an aluminum composition index. In some embodiments, "$\chi$" has a value between 0.2 and 0.25. In some embodiments, HEMT bottom spacer sub-layer 430-5 has a thickness between 20 Å and 50 Å.

According to some embodiments, HEMT layer 430 includes a HEMT channel sub-layer 430-6. In some embodiments, HEMT channel sub-layer 430-6 comprises undoped $In_\delta Ga_{1-\delta}As$ where "$\delta$" is an Indium (In) composition index. In some embodiments, "$\delta$" has a value between 0.0 and 0.25. When "$\delta$" is greater than zero, HEMT 400-2 is a pseudomorphic HEMT (pHEMT). In some embodiments, HEMT channel sub-layer 430-6 has a thickness between 80 Å and 150 Å.

According to some embodiments, HEMT layer 430 includes a HEMT top spacer sub-layer 430-7. In some embodiments, HEMT top spacer sub-layer 430-7 comprises undoped $Al_\in Ga_{1-\in}As$ where "$\in$" is an aluminum composition index. In some embodiments, "$\in$" has a value between 0.2 and 0.25. In some embodiments, HEMT top spacer sub-layer 430-7 has a thickness between 20 Å and 50 Å.

According to some embodiments, HEMT layer 430 includes a top planar doping sub-layer 430-8. In some embodiments, top planar doping sub-layer 430-8 is a delta-doping sub-layer comprising silicon (Si). In some circumstances, because top planar doping sub-layer 430-8 is a delta-doping sub-layer, it has substantially no thickness as the silicon atoms diffuse substantially entirely into adjacent layers. Bottom planar doping sub-layer 430-4 and top planar doping sub-layer 430-8 provide several electronic benefits to the electronic channel, including high carrier density, proximity between the channel and gate, increased breakdown voltage and reduced short-channel effects. Alternatively, bottom planar doping sub-layer 430-4 has a thickness of one to several monolayers.

According to some embodiments, HEMT layer 430 includes a HEMT barrier sub-layer 430-9. In some embodiments, HEMT barrier sub-layer 430-9 comprises $Al_\phi Ga_{1-\phi}As$ where "$\phi$" is an aluminum composition index. In some embodiments, "$\phi$" has a value between 0.2 and 0.25. In some embodiments, HEMT barrier sub-layer 430-9 is doped with silicon (Si) atoms (i.e., the dopant atoms comprise Si) at a doping concentration on the order of $1.0 \times 10^{17}$ dopant atoms/$cm^3$. In some embodiments, HEMT barrier sub-layer 430-9 has a thickness between 200 Å and 300 Å.

According to some embodiments, HEMT layer 430 includes a HEMT cap sub-layer 430-10. In some embodiments, HEMT cap sub-layer 430-10 comprises GaAs. In some embodiments, HEMT cap sub-layer 430-10 is doped with silicon (Si) atoms (i.e., the dopant atoms comprise Si) at a doping concentration on the order of $1.0 \times 10^{18}$ dopant atoms/$cm^3$. In some embodiments, HEMT cap sub-layer 430-10 has a thickness between 100 Å and 500 Å.

According to some embodiments, contact layer 428 includes a contact grading sub-layer 428-1. In some embodiments, contact grading sub-layer 428-1 comprises $In_\gamma Ga_{1-\gamma}As$ where "$\gamma$" is an indium (In) composition index. The indium (In) composition $\gamma$ of contact grading sub-layer 428-1 varies substantially monotonically with a distance from a first surface of grading sub-layer 428-1. For example, in some embodiments, HEMT cap sub-layer 430-10 is GaAs and the indium (In) composition $\gamma$ of contact grading sub-layer 428-1 varies substantially monotonically from $\gamma=0$ at a surface proximal to HEMT cap sub-layer 430-10 to $\gamma=\eta$ at a surface distal to HEMT cap sub-layer 430-10, where $\eta$ is a fixed indium (In) composition index (i.e., $\eta$ has a fixed predefined value). Contact grading sub-layer 428-1 thus provides a smooth grading from a pure GaAs material to an $In_\eta Ga_{1-\eta}As$ material with a fixed indium (In) composition index of $\eta$. In some embodiments, the indium (In) composition index $\gamma$ varies substantially monotonically with distance from the surface proximal to HEMT cap sub-layer 430-10 in accordance with a predefined spatial function. In some embodiments, contact grading sub-layer 428-10 is doped with tellurium (Te) atoms (i.e., the dopant atoms comprise Te) at a doping concentration greater than $1.0 \times 10^{19}$ dopant atoms/$cm^3$. In some embodiments, contact grading sub-layer 428-1 has a thickness between 500 Å and 1,000 Å.

According to some embodiments, contact layer 428 optionally includes a contact sub-layer 428-2. In some embodiments, contact sub-layer 428-2 comprises $In_\eta Ga_{1-\eta}As$ sub-layer 324-2, where $\eta$ is the fixed indium (In) composition index. In some embodiments, the value of $\eta$ is a predefined value between 0.1 and 1.0. In some embodiments, $\eta$ has a predefined value substantially equal to 0.6. In some embodiments, contact sub-layer 428-2 is n+ doped InGaAs. In some embodiments, contact sub-layer 428-2 is doped with tellurium (Te) atoms (i.e., the dopant atoms comprise Te) at a doping concentration greater than $1.0 \times 10^{19}$ dopant atoms/$cm^3$. In some embodiments, contact sub-layer 428-2 has a thickness between 500 Å and 1,000 Å.

According to some embodiments, drain conductive layer 432-$b$ comprise a conductive material. In some embodiments, the conductive material comprises one of the following metal structures Ti/Al, TiW/Al, or Ti/TiN/Al (where the "/" designates alternating or successive layers).

Figure 5:
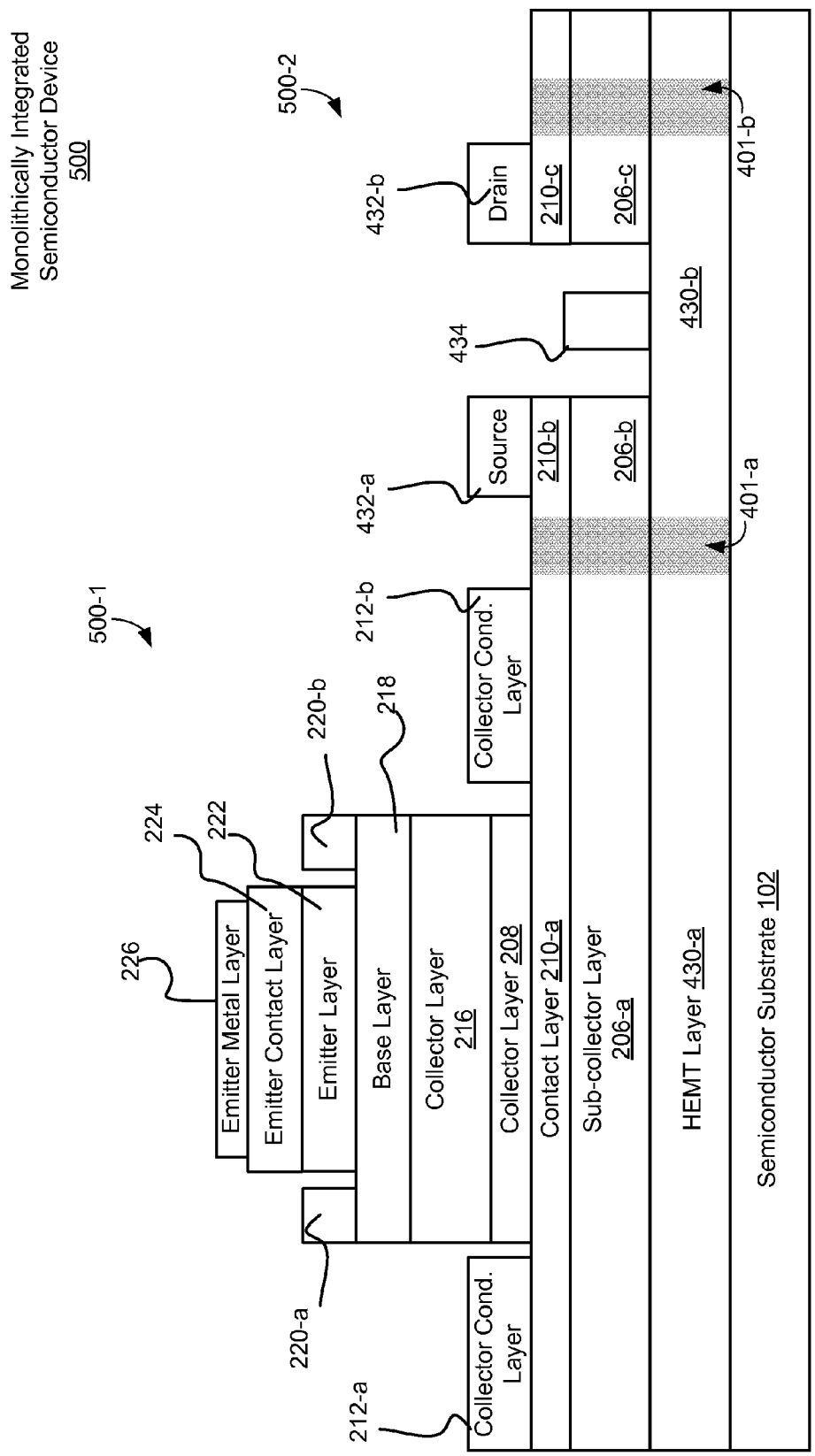
FIG. 5 is a schematic cross-sectional view of a monolithically integrated semiconductor device, in accordance with some embodiments.

FIG. 5 is a schematic cross-sectional view of a monolithically integrated semiconductor device 500, in accordance with some embodiments. Monolithically integrated semiconductor device 500 includes a heterojunction bipolar transistor 500-1 having a collector, base, and emitter. In some embodiments, heterojunction bipolar transistor 500-1 is a double heterojunction bipolar transistor (DHBT). Monolithically integrated semiconductor device 500 also includes a high-electron-mobility transistor (HEMT) 500-2, which is a field-effect transistor having a source and a drain. In some embodiments, heterojunction bipolar transistor 500-1 and high-electron-mobility transistor 500-2 are components in a microwave monolithically integrated circuit (MMIC). Monolithically integrated semiconductor device 500 is fabricated on semiconductor substrate 102, which is described with reference to FIG. 1.

High-electron-mobility transistor 500-2 is electrically isolated from other circuit components including heterojunction bipolar transistor 500-1 by isolation regions 401 (e.g., 401-$a$ and 401-$b$), described with reference to FIG. 4A.

High-electron-mobility transistor 500-2 includes a first instance of HEMT layer 430 (e.g., HEMT layer 430-$b$), first and second distinct instances of sub-collector layer 206 (e.g., sub-collector layers 206-$b$ and 206-$c$) disposed upon HEMT layer 430-$b$, and first and second distinct instances of contact layer 210 (e.g., contact layers 210-$b$ and 210-$c$). Contact layer 210-$b$ is disposed upon sub-collector layer 206-$b$, and contact layer 210-$c$ is disposed upon sub-collector layer 206-$c$.

Contact layer 210 has a thickness that is less than a critical thickness. The critical thickness is a thickness below which, and only below which, contact layer 210 remains epitaxial with sub-collector layer 206. Viewed another way, under the critical thickness, the crystal structure of contact layer 210 is sufficiently pliable to adopt the underlying crystal structure of sub-collector layer 206, and in doing so, the crystal structure of contact layer 210 provides a crystalline template on which further epitaxial layers are disposed. For thicknesses greater than the critical thickness, crystal lattice mismatch causes the crystal structure of contact layer 210 to relax and generate material defects that degrade the quality of subsequent epitaxial layers grown on top of it.

High-electron-mobility transistor 500-2 further includes first and second distinct instances of conductive layer 432 (e.g., conductive layer instances (also called conductive layers) 432-a and 432-b). Conductive layer 432-a is disposed upon contact layer 210-b to form an ohmic source contact. Conductive layer 432-b is disposed upon contact layer 210-c to form an ohmic drain contact.

Heterojunction bipolar transistor 500-1 include a second distinct instance of HEMT layer 430 (e.g., HEMT layer 430-a), a third distinct instance sub-collector layer 206 (e.g., sub-collector layer 206-a), a third distinct instance of contact layer 210 (e.g., contact layer 210-a), and one or more distinct instances of conductive layer 212 (e.g., conductive layers 212-a and 212-b). In some embodiments, in lieu of conductive layer 212, Heterojunction bipolar transistor 500-1 includes a third distinct instance of conductive layer 432. In any event, the one or more instances of conductive layer 212 or the third instance of conductive layer 432 is disposed upon contact layer 210-a to form an ohmic collector contact. Collector layer 208 is disposed epitaxially upon the third instance of the contact layer. The conductive layer is compatible with silicon processing techniques (e.g., conductive layer 112 does not comprise gold).

Heterojunction bipolar transistor 500-1 also includes collector layer 208; collector layer 216; base layer 218; base conductor layer 220; emitter layer 222; emitter contact layer 224; emitter conductor layers 226, all of which have been described with reference to FIG. 2. and FIG. 3.

Because high-electron-mobility transistor 500-2 shares sub-collector layer 206 (albeit distinct instances) with heterojunction bipolar transistor 500-1, only a single contact layer (albeit distinct instances) is required for the collector of heterojunction bipolar transistor 500-1 as well as the source and drain of high-electron-mobility transistor 500-2, thus simplifying the epitaxial growth of the layer structure.

FIG. 6A illustrates a schematic diagram of a top view of a circuit disposed on a semiconductor die 600. Semiconductor die 600 includes a circuit that optionally includes an HBT (e.g., HBT 400-1, or HBT 500-1) and a HEMT (e.g., HEMT 400-2, or HEMT 500-2) that are monolithically integrated onto semiconductor die 600. The circuit also optionally includes one or more of semiconductor device 100, HBT 200, and HBT 300 (not shown).

HBT 400-1/500-1 is optionally coupled through one or more interconnections (e.g., metal interconnections 602-a, 602-b, 602-c, 602-d) to one or more additional components 604 (e.g., resistors, capacitors, inductors, transistors, diodes, etc.). For example, one or more of the collector, base, or emitter of HBT 400-1/500-1 is coupled through the one or more interconnections to the additional components 604. In some embodiments, HBT 400-1/500-1 is coupled (e.g., through its base, collector, or emitter) to respective ones of metal contacts 606 (e.g., metal contacts 606-a, 606-b, 606-c, 606-d, 606-e, 606-f) of which there are an arbitrary number. In general, contact pads 606 electrically couple a circuit disposed on the substrate of the semiconductor die to separate electrical devices (e.g., off of the semiconductor die).

FIG. 6B illustrates a cross-sectional side view of a flip chip apparatus 608. Flip chip apparatus 608 provides gallium arsenide based transmission lines without the need for precision wafer thinning and back-side metallization.

Flip chip apparatus 608 includes a flip chip module 610 mechanically and electrically coupled to semiconductor die 600. Flip chip module 608 includes a ground plane 612 that, together with metal interconnections 602, forms one or more transmission lines. Flip chip apparatus 608 further includes a plurality of metal connectors (e.g., metal bumps 614) mechanically and electrically coupled to metal contacts 606 (or a subset thereof). In some embodiments, the plurality of metal contacts include a metal contact electrically coupled to an ohmic contact on semiconductor die 600 (e.g., any one of ohmic contacts 114, collector ohmic contacts 214/314, emitter ohmic contacts 228/328, etc.).

In some embodiments, flip chip apparatus 608 further includes dielectric filler 616 disposed between semiconductor die 600 and connection plane 612 of flip chip module 610. In some embodiments, some portions of connection plane 612 function as a ground plane, while other portions of connection plane 612 provide DC or RF connections between transistors or other components of semiconductor die 600 and external connectors, for connections to devices or signals or the like external to semiconductor die 600. In some embodiments, a transmission line of the one or more transmission lines has a transmission line impedance (e.g., a characteristic impedance) corresponding to a thickness d of dielectric filler 616 disposed between semiconductor die 600 and connection plane 612 of flip chip module 610 and a dielectric constant $\in_d$ of the dielectric filler 616.

Flip chip apparatus 608 is configured to be coupled electrically and mechanically to external circuitry, for example external circuitry on a substrate 620 on which flip chip apparatus 608 is also mounted, with solder bumps 614 that have been deposited onto the chip pads (e.g., metal contacts 606 shown in FIG. 6A). In some embodiments, substrate 620 includes solder bumps 618 (e.g., 618-a to 618-f) for connecting specific portions of flip chip apparatus 608, and specific portions of semiconductor die 600, to substrate 620. In some other embodiments, flip chip apparatus 608 includes solder bumps 618 for connecting flip chip apparatus 608 to a substrate.

The foregoing description, for purpose of explanation, has been described with reference to specific embodiments. However, the illustrative discussions above are not intended to be exhaustive or to limit the embodiments to the precise forms disclosed. Many modifications and variations are possible in view of the above teachings. The embodiments were chosen and described in order to best explain the principles of the disclosure and its practical applications, to thereby enable others skilled in the art to best utilize the various embodiments with various modifications as are suited to the particular use contemplated.

What is claimed is:
1. A device, comprising:
a semiconductor die that includes a heterojunction bipolar transistor (HBT) having a collector, base, and emitter, the HBT including:
a plurality of semiconductor layers disposed on a gallium arsenide (GaAs) substrate, including:
a sub-collector layer having a first band-gap;
a contact layer of the collector having a second band-gap that is less than the first band-gap, wherein:
the contact layer is epitaxially disposed on the sub-collector layer; and the contact layer has a thickness less than a critical thickness, wherein the critical thickness is a thickness below which the contact layer remains epitaxial with the sub-collector layer;
a collector layer of the collector having a third band-gap that is larger than the second band-gap, wherein the collector layer is epitaxially disposed on the contact layer;
one or more base layers of the base epitaxially disposed upon a respective layer of the collector; and
one or more emitter layers of the emitter epitaxially disposed upon a respective layer of the base; and
a conductive layer disposed upon the contact layer to form an ohmic contact for the collector, wherein the conductive layer comprises one or more metal layers compatible with silicon processing techniques.

2. The device of claim 1, wherein the conductive layer does not comprise gold.

3. The device of claim 1, wherein the contact layer substantially comprises germanium (Ge).

4. The device of claim 1, wherein the conductive layer comprises a metal selected from the group consisting of: Ti, Al, Ni, W, Ge, Pd, Pt, Cu, combinations thereof, and alloys thereof.

5. The device of claim 1, wherein the contact layer substantially comprises one of $In_xGa_{1-x}As$ or $In_xGa_{1-x}Sb$.

6. The device of claim 5, wherein x is a value between 0.1 and 0.9.

7. The device of claim 5, wherein the critical thickness is determined in accordance with a value of x.

8. The device of claim 1, further comprising metal interconnections between circuit components of a circuit disposed on the GaAs substrate of the semiconductor die.

9. The device of claim 8, wherein the metal interconnections comprise aluminum-based metal interconnections or copper-based metal interconnections.

10. The device of claim 8, further comprising:
a flip chip module mechanically and electrically coupled to the semiconductor die, the flip chip module including a ground plane that, together with the metal interconnections, forms one or more transmission lines, and a plurality of metal connectors mechanically and electrically coupled to a plurality of metal contacts of the circuit disposed on the GaAs substrate of the semiconductor die; wherein the plurality of metal contacts includes a metal contact electrically coupled to the ohmic contact.

11. The device of claim 10, further comprising dielectric filler disposed between the semiconductor die and the ground plane of the flip chip module, wherein a transmission line of the one or more transmission lines has a transmission line impedance corresponding to a thickness of the dielectric filler disposed between the semiconductor die and the ground plane of the flip chip module and a dielectric constant of the dielectric filler.

12. A device, comprising:
a semiconductor die that includes:
a plurality of semiconductor layers disposed on a GaAs substrate, including a first semiconductor layer having a first band-gap and a second semiconductor layer having a second band-gap;
a contact layer disposed epitaxially upon the first semiconductor layer, wherein:
the contact layer has a thickness that is less than a critical thickness, wherein the critical thickness is a thickness below which the contact layer remains epitaxial with the first semiconductor layer;
the second semiconductor layer is epitaxially disposed upon the contact layer; and
the contact layer has a third band-gap that is less than the first band-gap and the second band-gap; and
a conductive layer disposed upon the contact layer to form an ohmic contact, wherein the conductive layer comprises one or more metal layers compatible with silicon processing techniques.

13. The device of claim 1, wherein the device further comprises a field effect transistor (FET), having a gate, source, and drain;
the FET further including:
first and second distinct instances of the contact layer, the first instance of the contact layer comprising the source and the second instance of the contact layer comprising the drain; and
first and second distinct instances of the conductive layer, the first instance of the conductive layer disposed upon the first instance of contact layer to form an ohmic source contact, the second instance of the conductive layer disposed upon the second instance of the contact layer to form an ohmic drain contact.

14. The device of claim 13, wherein the FET is a metal semiconductor field effect transistor (MESFET).

15. The device of claim 13, wherein the FET is a high electron-mobility transistor (HEMT).

16. The device of claim 15, wherein the HEMT is a pseudomorphic HEMT (pHEMT).

17. The device of claim 13, further comprising one or more additional active circuit components monolithically integrated onto the semiconductor die, wherein the device is a monolithically integrated circuit.

* * * * *